United States Patent
Taniguchi et al.

(10) Patent No.: US 9,049,081 B2
(45) Date of Patent: Jun. 2, 2015

(54) RECEIVER

(71) Applicant: KABUSHIKI KAISHA TOSHIBA, Minato-ku, Tokyo (JP)

(72) Inventors: Kentaro Taniguchi, Kawasaki (JP); Katsuya Nonin, Kawasaki (JP); Kazumi Sato, Kawasaki (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/156,012

(22) Filed: Jan. 15, 2014

(65) Prior Publication Data
US 2015/0071386 A1 Mar. 12, 2015

(30) Foreign Application Priority Data
Sep. 9, 2013 (JP) .................................. 2013-186633

(51) Int. Cl.
*H04L 27/148* (2006.01)

(52) U.S. Cl.
CPC .................................... *H04L 27/148* (2013.01)

(58) Field of Classification Search
CPC . H04L 1/0045; H04L 27/261; H04L 27/2647; H04L 27/2649; H04L 27/2663; H04L 27/2675; H04L 27/2655; H04L 1/0047; H04L 2027/0024; H04L 2027/0095; H04L 25/0202; H04L 27/22; H04B 7/0811; H04B 1/1036; H04B 1/06; H04B 1/7183; H04B 7/15535

USPC .......................... 375/334, 230, 344, 345, 324
See application file for complete search history.

(56) References Cited

U.S. PATENT DOCUMENTS

| | | | |
|---|---|---|---|
| 7,386,285 B2 | 6/2008 | Yamauchi | |
| 8,059,726 B2 | 11/2011 | Aoki et al. | |
| 2004/0242177 A1* | 12/2004 | Yang | .......................... 455/234.1 |
| 2007/0115801 A1* | 5/2007 | Li et al. | .......................... 370/208 |

FOREIGN PATENT DOCUMENTS

| | | |
|---|---|---|
| JP | 2000068973 A | 3/2000 |
| JP | 2005210690 A | 8/2005 |
| JP | 2006109200 A | 4/2006 |

* cited by examiner

*Primary Examiner* — Kabir A Timory
(74) *Attorney, Agent, or Firm* — White & Case LLP

(57) ABSTRACT

According to one embodiment, a receiver, which is configured to receive a radio signal having a preamble including a synchronization pattern and a payload containing data, includes an antenna, a low noise amplifier, a down-conversion module, a variable gain amplifier, an auto gain controller, a synchronization acquisition module, and a demodulator. The antenna is configured to receive the radio signal. The low noise amplifier is configured to amplify an output from the antenna by applying a first variable gain. The down-conversion module is configured to down-convert an output from the low noise amplifier. The variable gain amplifier is configured to amplify an output from the down-conversion module by applying a second variable gain. The auto gain controller is configured to, in accordance with strength of the radio signal, firstly adjust the first variable gain, and after fixing the first variable gain, adjust the second variable gain.

16 Claims, 7 Drawing Sheets

RECEIVER

CROSS REFERENCE TO RELATED APPLICATIONS

This application is based upon and claims the benefit of priority from the prior Japanese Patent Application No. 2013-186633, filed on Sep. 9, 2013, the entire contents of which are incorporated herein by reference.

FIELD

Embodiments described herein relate generally to a receiver.

BACKGROUND

In a wireless communication system that transmits and receives packet signals, a synchronization pattern is acquired by using the preamble at the beginning of a packet, and the payload is then demodulated. Therefore, so as to demodulate the payload correctly, it is important to acquire the synchronization pattern with high precision.

DETAILED DESCRIPTION

In general, according to one embodiment, a receiver, which is configured to receive a radio signal having a preamble including a synchronization pattern and a payload containing data, includes an antenna, a low noise amplifier, a down-conversion module, a variable gain amplifier, an auto gain controller, a synchronization acquisition module, and a demodulator.

The antenna is configured to receive the radio signal. The low noise amplifier is configured to amplify an output from the antenna by applying a first variable gain. The down-conversion module is configured to down-convert an output from the low noise amplifier. The variable gain amplifier is configured to amplify an output from the down-conversion module by applying a second variable gain. The auto gain controller is configured to, in accordance with strength of the radio signal, firstly adjust the first variable gain, and after fixing the first variable gain, adjust the second variable gain. The synchronization acquisition module is configured to acquire the synchronization pattern not using a portion of the preamble to which the first variable gain being adjusted is applied but using at least part of a portion of the preamble to which the second variable gain being adjusted is applied. The demodulator is configured to demodulate the payload in synchronization with the synchronization pattern acquisition by the synchronization acquisition module.

The following is a detailed description of embodiments, with reference to the drawings.

First Embodiment

Figure 1:
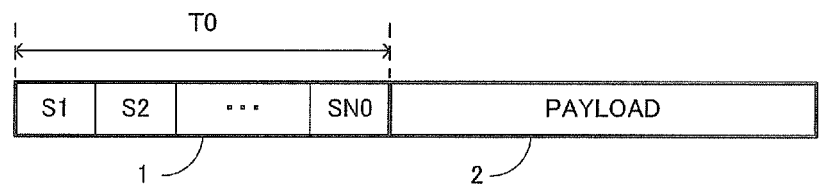
FIG. 1 is a diagram schematically showing the structure of a radio signal to be received by a receiver according to the present embodiment.

FIG. 1 is a diagram schematically showing the structure of a radio signal to be received by a receiver according to the present embodiment. The radio signal includes at least a preamble 1 and a payload 2. The preamble 1 is a known signal, and contains a predetermined synchronization pattern. The duration of the preamble 1 is a predetermined time T0, and there exist a number N0 of symbols S1 through SN0 in the duration. The payload 2 contains data to be demodulated by the receiver.

Figure 2:
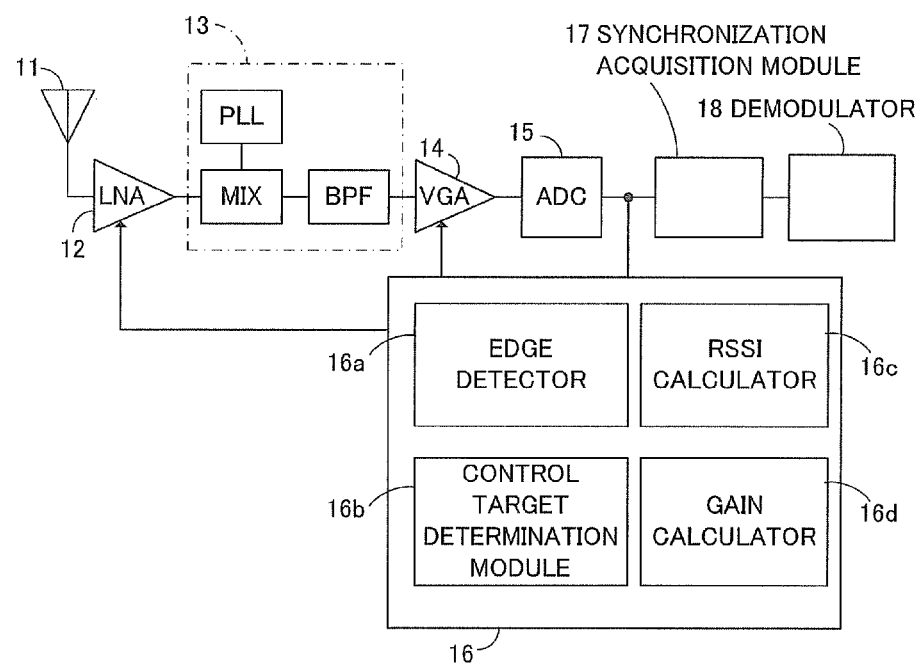
FIG. 2 is a block diagram schematically showing the structure of a receiver 100 according to the first embodiment.

FIG. 2 is a block diagram schematically showing the structure of a receiver 100 according to the first embodiment. The receiver 100 includes an antenna 11, a low noise amplifier (LNA) 12, a down-conversion module 13, a variable gain amplifier (VGA) 14, an AD (Analog to Digital) converter 15, an auto gain controller (AGC) 16, a synchronization acquisition module 17, and a demodulator 18.

The antenna 11 receives the radio signal shown in FIG. 1. This radio signal is a signal in a radio frequency (RF) band, and has a relatively high frequency.

The low noise amplifier 12 amplifies the output from the antenna 11 by applying a variable gain (a first variable gain) that is set by the auto gain controller 16. The low noise amplifier 12 is located at the front end of the receiver 100, and processes signals with high frequencies.

The down-conversion module 13 down-converts the output from the low noise amplifier 12. More specifically, the down-conversion module 13 includes a phase lock loop (PLL) 13a, a mixer (MIX) 13b, and a band pass filter (BPF) 13c.

The phase lock loop 13a generates a reference signal. The frequency of this reference signal is equal to the frequency signal of the radio signal. The mixer 13b mixes the output from the low noise amplifier 12 and the reference signal. As a result, the output signal from the low noise amplifier 12 is converted from a signal in a radio frequency (RF) band into a signal at a lower frequency in a baseband (BB) band. The band pass filter 13c removes unnecessary frequency bands, and extracts a desired frequency band.

The variable gain amplifier 14 amplifies the output from the down-conversion module 13 by applying a variable gain (a second variable gain) that is set by the auto gain controller 16. The variable gain amplifier 14 is provided in a stage after the down-conversion module 13, and processes signals with lower frequencies, compared with the low noise amplifier 12.

The AD converter 15 converts the output from the variable gain amplifier 14 into a digital signal.

The auto gain controller 16 sets the variable gain of the low noise amplifier 12 and the variable gain of the variable gain amplifier 14 in accordance with the strength of a received radio signal. As one of the features of the present embodiment, the auto gain controller 16 firstly adjusts the variable gain of the low noise amplifier 12, and after fixing the variable gain of the low noise amplifier 12, adjusts the variable gain of the variable gain amplifier 14. This aspect will be described later in detail.

The auto gain controller 16 includes an edge detector 16a, a control target determination module 16b, a received signal strength indicator (RSSI) calculator 16c, and a gain calculator 16d.

The edge detector 16a detects a start edge of the radio signal shown in FIG. 1. The control target determination module 16b determines whether to adjust the variable gain of the low noise amplifier 12 or adjust the variable gain of the variable gain amplifier 14. The RSSI calculator 16c calculates the strength of the radio signal based on outputs from the AD converter 15. For example, the RSSI calculator 16c may calculate the strength of the radio signal from the mean value of outputs from the AD converter 15. Alternatively, the strength of the radio signal may be calculated from the maximum amplitude value of outputs from the AD converter 15. The gain calculator 16d calculates variable gains of the low noise amplifier 12 and the variable gain amplifier 14 in accordance with the strength of the radio signal. More specifically, the gain calculator 16d sets a greater variable gain as the radio signal has lower strength.

The synchronization acquisition module 17 acquires the synchronization pattern by using a portion of the preamble 1. As the portion to be used is longer, the synchronization acquisition module 17 can acquire the synchronization pattern with higher precision. The synchronization acquisition module 17 of the present embodiment does not use a portion of the preamble 1 of the radio signal to which the variable gain of the low noise amplifier 12 being adjusted is applied, but uses a portion of the preamble 1 of the radio signal to which the fixed variable gain of the low noise amplifier 12 is applied. Further, the synchronization acquisition module 17 also uses at least a portion of the preamble 1 to which the gain of the variable gain amplifier 14 being adjusted is applied.

In other words, a portion of the preamble 1 is used only for determining the variable gain of the low noise amplifier 12, and a following portion is used for both determining a gain of the variable gain amplifier 14 and acquiring the synchronization pattern. In this manner, the synchronization pattern can be accurately acquired as described later.

The demodulator 18 demodulates the payload 2 to obtain data in synchronization with the synchronization pattern acquisition by the synchronization acquisition module 17.

As described above, the receiver 100 shown in FIG. 2 includes two different amplifiers, that is, the low noise amplifier 12 and the variable gain amplifier 14.

The low noise amplifier 12 is located at the front end of the receiver 100, and performs coarse adjustments of signal strengths. Accordingly, the variable gain of the low noise amplifier 12 has a relatively wide fluctuation range. Meanwhile, the variable gain amplifier 14 is provided in a stage after the down-conversion module 13, and performs fine adjustments of signal strengths. Accordingly, the variable gain of the variable gain amplifier 14 does not have a so wide fluctuation range.

Furthermore, the low noise amplifier 12 processes signals in radio frequency bands. On the other hand, the variable gain amplifier 14 processes baseband signals. That is, the frequencies of signals to be processed by the low noise amplifier 12 are higher.

Due to such differences, phase shifting occurs between an input signal and an output signal at the low noise amplifier 12 when the variable gain thereof fluctuates, but phase shifting hardly occurs between an input signal and an output signal at the variable gain amplifier 14 even when the variable gain thereof fluctuates. When a symbol in which phase shifting has occurred among the symbols in the preamble 1 is used, the synchronization acquisition module 17 might not be able to acquire the synchronization pattern with precision.

Therefore, in acquiring the synchronization pattern in this embodiment, a symbol to which the variable gain of the low noise amplifier 12 being adjusted (fluctuating) is applied, namely a symbol with a possibility of having large phase shifting, is not used. Instead, a symbol to which a variable gain that has been fixed and become constant is applied, namely a symbol not having large phase shifting, is used. In this manner, the synchronization acquisition module 17 can acquire the synchronization pattern with high precision.

The synchronization acquisition module 17 does not wait until the variable gain of the variable gain amplifier 14 is fixed, but acquires the synchronization pattern by also using a symbol to which a variable gain being adjusted is applied. This is because phase shifting hardly occurs in the variable gain amplifier 14 even when the variable gain thereof is being adjusted. As described above, by adjusting the gain of the variable gain amplifier 14 in parallel with the acquisition of the synchronization pattern, the portion of the preamble 1 to be used in acquiring the synchronization pattern can be made longer.

Figure 3:
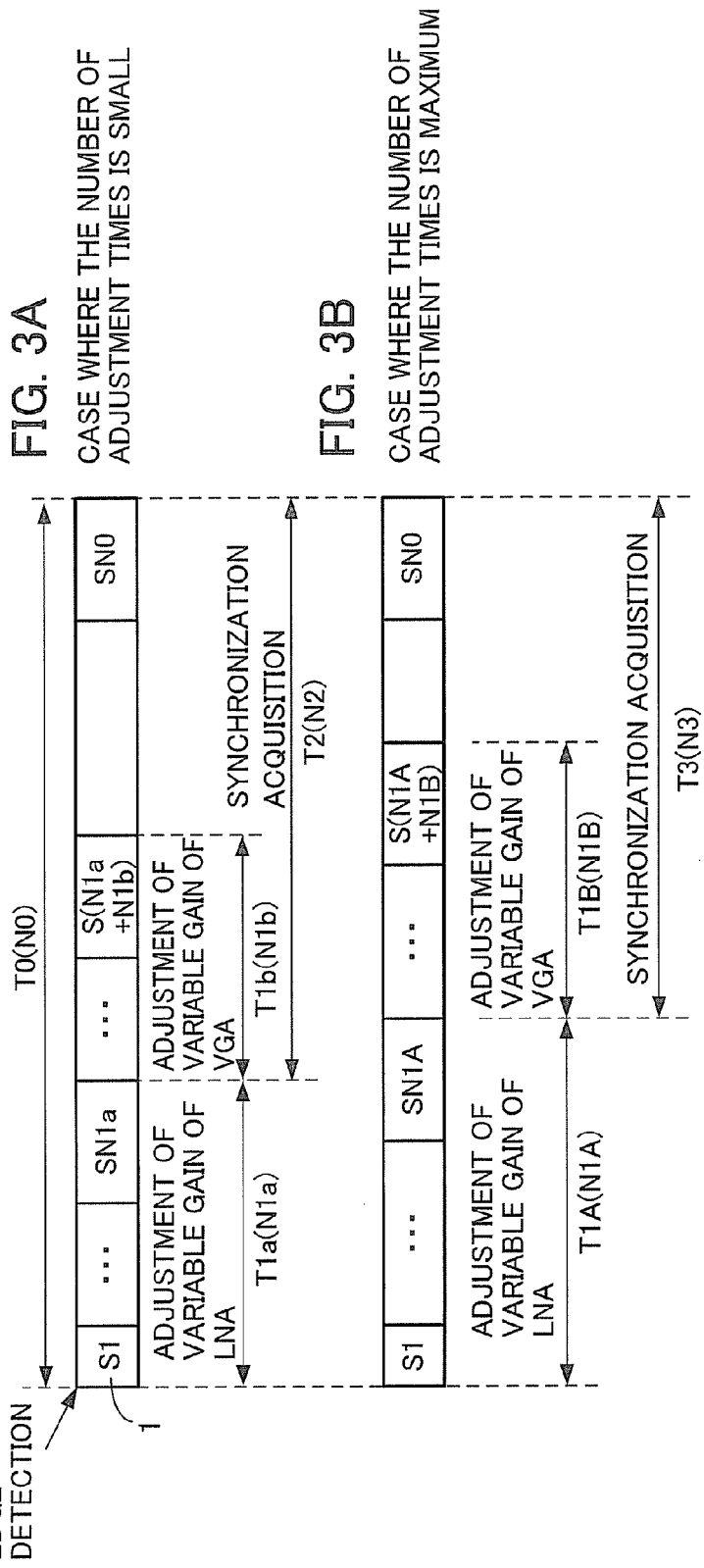
FIGS. 3A and 3B are diagrams schematically showing the processing to be performed on the preamble 1.

FIGS. 3A and 3B are diagrams schematically showing the processing to be performed on the preamble 1. Referring now to FIGS. 3A and 3B, timings of variable gain adjustments and synchronization acquisitions are described in detail. FIG. 3A is a diagram illustrating a case where the number of adjustment times at the low noise amplifier 12 and the variable gain amplifier 14 is small. FIG. 3B is a diagram illustrating a case where the number of adjustment times at the low noise amplifier 12 and the variable gain amplifier 14 is the maximum.

In the drawing, a time T1A is the maximum time that a variable gain adjustment time T1a at the low noise amplifier 12 can be, and is a fixed value that is set beforehand at the time of designing. The time T1a varies with received power. A time T1B is the maximum time that a variable gain adjustment time T1b at the variable gain amplifier 14 can be, and is a fixed value that is set beforehand at the time of designing. The time T1B varies with received power. Details will be described.

When the edge detector 16a detects a start edge of a radio signal, the auto gain controller 16 firstly adjusts the variable gain of the low noise amplifier 12. That is, the control target determination module 16b sets the low noise amplifier 12 as the variable gain adjustment target. Based on signal strength calculated by the RSSI calculator 16c, the gain calculator 16d adjusts the variable gain of the low noise amplifier 12 so that the amplitude of an output signal from the AD converter 15 approaches a desired value.

This adjustment is performed on the portion in the time T1a (T1a≤T1A) from the beginning of the preamble 1, or more specifically, on N1a of symbols S1 through SN1a existing in the time T1a. The variable gain of the low noise amplifier 12 is fixed by the adjustment performed on the portion (the N1a symbols) in the time T1a, and thereafter, becomes constant.

That is, the low noise amplifier 12 applies a variable gain being adjusted to the N1a symbols from the beginning, and applies a variable gain that has been fixed and become constant to the following symbols.

The time T1a and the number N1a of symbols might vary with the power of a received radio signal, but the maximum values T1A and N1A of those values are predetermined fixed values.

As described above, the phase shifting between an input signal and an output signal at the low noise amplifier 12 might become larger while the variable gain of the low noise amplifier 12 is being adjusted. When the variable gain of the low noise amplifier 12 is constant, on the other hand, phase shifting hardly occurs.

After performing processing on the N1a symbols, the auto gain controller 16 adjusts the variable gain of the variable gain amplifier 14. That is, the control target determination module 16b sets the variable gain amplifier 14 as the variable gain adjustment target. Based on the received signal strength calculated by the RSSI calculator 16c, the gain calculator 16d adjusts the variable gain of the variable gain amplifier 14 so that the amplitude of the output signal from the AD converter 15 approaches a desired value.

This adjustment is performed on the portion in a time T1b after the end of the time T1a from the beginning of the preamble 1, or more specifically, on N1b of symbols S (N1a+1) through S (N1a+N1b) existing in the time T1b. The variable gain of the variable gain amplifier 14 is fixed by the adjustment performed on the portion (the N1b symbols) in the time T1b, and thereafter, becomes constant. The time T1b and the number N1b of symbols might vary with the power of a received radio signal, but the maximum values T1B and N1B of those values are predetermined fixed values.

As described above, phase shifting between an input signal and an output signal does not become large at the variable gain amplifier 14 even when the variable gain thereof is being adjusted.

Meanwhile, the synchronization acquisition module 17 performs a synchronization pattern acquisition process by using the portion of the preamble 1 in which the variable gain of the variable gain amplifier 14 is being adjusted after the variable gain of the low noise amplifier 12 is fixed. That is, the synchronization acquisition module 17 can use, for the synchronization pattern acquisition process, the portion of the preamble 1 that lasts for the time T0 minus the time T1a from the beginning. Where the time that can be used by the synchronization acquisition module 17 in the preamble 1 is T2, the following expressions (1) and (2) are satisfied.

$$T2 = T0 - T1a \quad (1)$$

$$T1a + T1b + T2 \geq T0 \quad (2)$$

The above expression (1) indicates that the portion of the preamble 1 that can be used for the synchronization pattern acquisition process can be made longer. If the synchronization pattern is acquired after the variable gains of both the low noise amplifier 12 and the variable gain amplifier 14 are fixed, the time that can be used for the synchronization pattern acquisition process is equal to (T0-T1a-T1b). This is shorter than the time expressed by the expression (1), and, in the shorter period of time, the synchronization pattern might not be acquired with high precision.

In this embodiment, on the other hand, the synchronization pattern is acquired while the variable gain of the variable gain amplifier 14 is being adjusted. Accordingly, the time to be used for the synchronization pattern acquisition process can be made longer as shown in the above expression (1). As a result, the synchronization pattern can be acquired with high precision.

The expression (2) indicates that the sum of the time (T1a+T1b) required for the gain adjustments and the time T2 for the synchronization pattern acquisition process may be longer than the duration T0 of the preamble 1.

Where the number of symbols existing in the time T2 is N2, the above expressions (1) and (2) can also be shown as the following expressions (1') and (2'), respectively.

$$N2 = N0 - N1a \quad (1')$$

$$N1a + N1b + N2 \geq N0 \quad (2')$$

Figure 4:
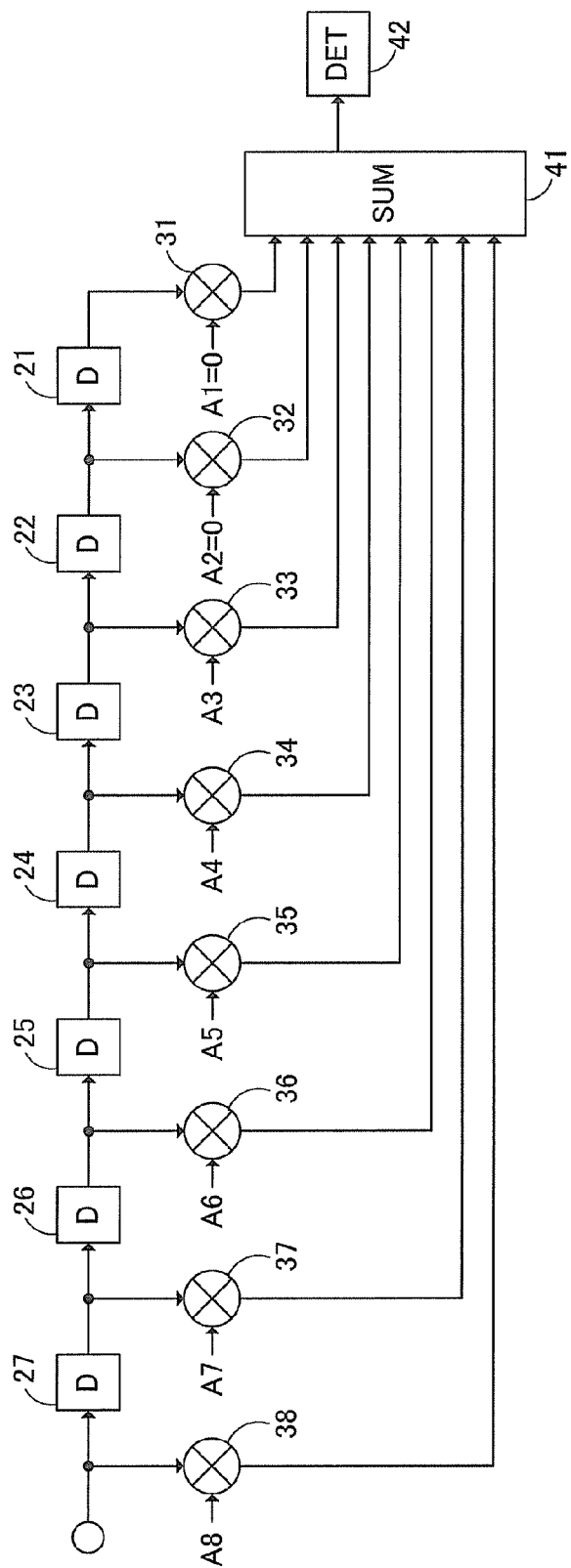
FIG. 4 is a diagram showing an example internal structure of the synchronization acquisition module 17.

Next, a specific example of the synchronization pattern acquisition process is described. FIG. 4 is a diagram showing an example internal structure of the synchronization acquisition module 17. This synchronization acquisition module 17 acquires synchronization with correlators. The synchronization acquisition module 17 includes delay elements 21 through 27, multipliers 31 through 38, an adder 41 (SUM), and a determiner 42 (DET). For simplification of the drawing, the total number of symbols in the preamble 1 is assumed to be N0=8, and the number of symbols to which the variable gain of the low noise amplifier 12 being adjusted is applied is assumed to be N1a=2.

The delay elements 21 through 27 delay the respective symbols by one unit. Although not shown in the drawing, a larger number of delay elements are provided in a case where the AD converter 15 performs oversampling. For example, in a case where the AD converter 15 performs sampling 100 times on one symbol, 99 delay elements are further provided between the delay element 21 and the delay element 22 and the like that are depicted successively in FIG. 4.

The multipliers 31 through 38 are provided for the respective symbols. Each multiplier 3k (k being an integer of 1 to 8) multiplies the corresponding symbol Nk by a predetermined coefficient Ak. In a case where the coefficient Ak is one of the two values of ±1, each multiplier 3k can have a simple structure formed only with a sign inverter. The adder 41 adds up the results of the multiplications performed by the multipliers 31 through 38. The determiner 42 determines whether there is a synchronization pattern based on the result of the addition. More specifically, when the value of the addition result is larger than a predetermined threshold value, the determiner 42 determines that a synchronization pattern is acquired.

Here, among the coefficients A1 through A8, the coefficients A1 and A2 to be multiplied by the beginning two symbols to which the variable gain of the low noise amplifier 12 being adjusted is applied are set to 0. Since the auto gain controller 16 can recognize the number N1a of symbols to which the variable gain of the low noise amplifier 12 is applied, the corresponding number N1a of coefficients A1 through AN1a should be set to 0. Since the N2 symbols to be subjected to synchronization acquisition are received later than the N1a symbols to be subjected to gain adjustments by the low noise amplifier 12, the coefficient at the synchronization acquisition module 17 can be changed in accordance with the result of the gain control performed on the low noise amplifier 12. Accordingly, the synchronization acquisition module 17 can perform the synchronization pattern acquisition process, without using of symbols to which the variable gain of the low noise amplifier 12 being adjusted is applied.

Furthermore, a coefficient set to be zero at the synchronization acquisition module 17 may be set in advance, instead of being adaptively set in accordance with the processing at the auto gain controller 16. In this case, the number N1a of symbols to which the variable gain of the low noise amplifier 12 is applied is unknown prior to auto gain adjustments, and therefore, the maximum number N1A of coefficients A1 through AN1A should be set to 0 in advance. As described above, the number N1A of symbols is a predetermined fixed number, and thus, the coefficients can also be set in advance. In this case, where the time that can be used by the synchronization acquisition module 17 in the preamble 1 is T3, the following expression (3) is satisfied.

$$T3 = T0 - T1A \quad (3)$$

As described above, in the first embodiment, the variable gain of the low noise amplifier 12 is firstly adjusted, and after the variable gain of the low noise amplifier 12 is fixed, the variable gain of the variable gain amplifier 14 is adjusted. Moreover, the synchronization acquisition module 17 does not use the portion of the preamble 1 to which a variable gain being adjusted is applied by the low noise amplifier 12, namely a portion with large phase shifting, but performs the synchronization pattern acquisition in parallel with the adjustment of the variable gain of the variable gain amplifier 14. Accordingly, the portion with small phase shifting in the preamble 1 can be used, and the portion to be used can be made longer. Thus, a synchronization pattern can be acquired with high precision.

Second Embodiment

A second embodiment described below relates to a receiver that performs frequency corrections.

Figure 5:
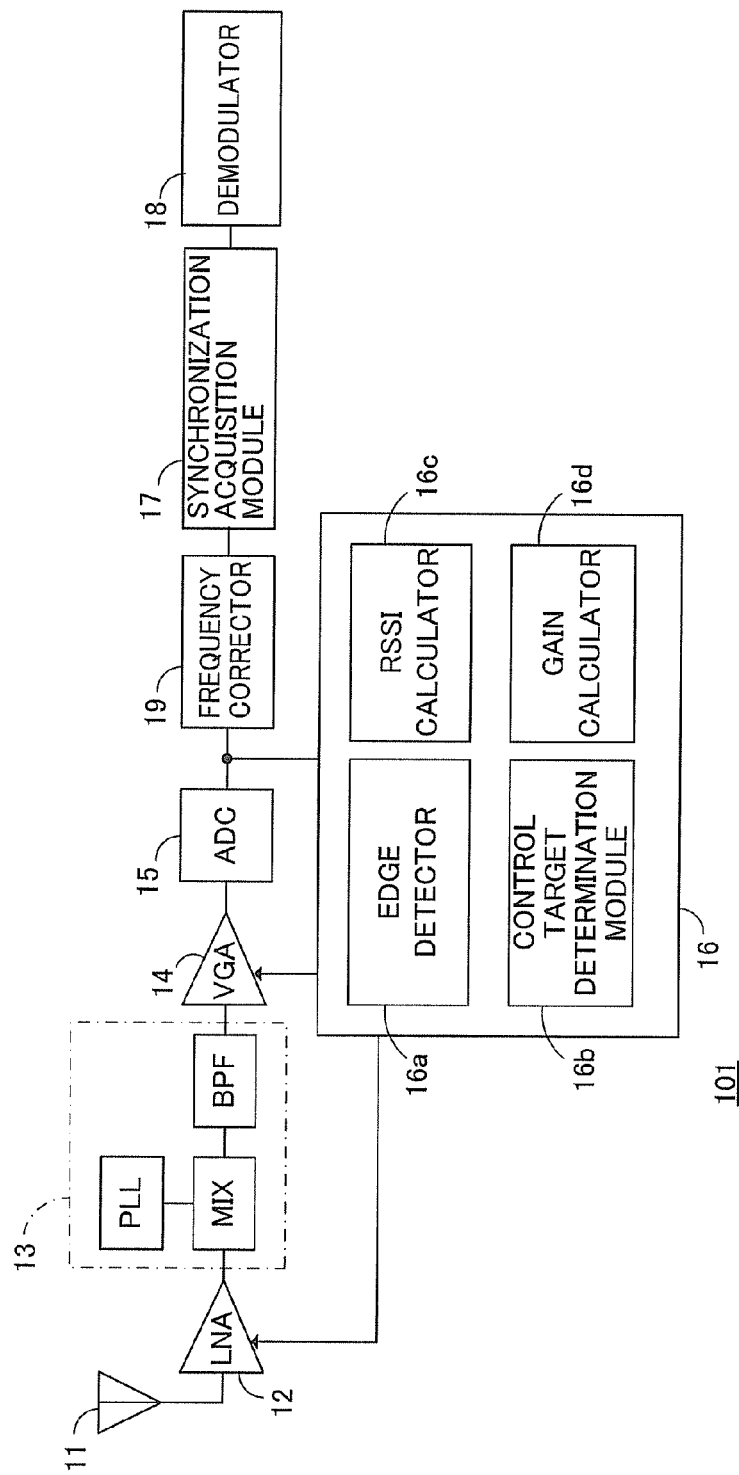
FIG. 5 is a block diagram schematically showing the structure of a receiver 101 according to the second embodiment.

FIG. 5 is a block diagram schematically showing the structure of a receiver 101 according to the second embodiment. Mainly the differences from the first embodiment will be described below.

The receiver 101 shown in FIG. 5 includes a frequency corrector 19 provided in a stage before the synchronization acquisition module 17. A frequency error might occur in the process of transmitting a radio signal, and the frequency corrector 19 is designed to correct such an error.

The frequency corrector 19 calculates a frequency error from the phase or frequency of an output signal from the AD converter 15, and performs a correction process. In a case where the received signal is a binary-FSK (Frequency Shift Keying)-modulated signal, for example, the mean value of the frequencies of output signals from the AD converter 15 should be the value intermediate between the minimum value and the maximum value. When a frequency error occurs, however, the mean value differs from the intermediate value. In view of this, the frequency corrector 19 accumulates the frequencies of output signals from the AD converter 15, and calculates a mean value. If the mean value differs from the above mentioned intermediate value, the frequency corrector 19 performs a frequency correction by offsetting the frequency of an output signal from the AD converter 15 by the amount equivalent to the difference.

However, phase shifting might occur in a symbol to which a variable gain being adjusted is applied by the low noise amplifier 12, as described above in the first embodiment. If phase shifting occurs, shifting naturally occurs also in the frequency information that is a time derivative of the phase shifting, and therefore, an accurate frequency correction cannot be performed.

In view of this, the frequency corrector 19 of the present embodiment does not use the N1a symbols to which a variable gain being adjusted is applied by the low noise amplifier 12. The frequency corrector 19 accumulates at least some of the N1b symbols to which a variable gain being adjusted is applied by the variable gain amplifier 14. In such a manner, the frequency corrector 19 can perform frequency corrections with high precision.

As described above, the frequency corrector 19 is provided in the second embodiment. The frequency corrector 19 performs frequency corrections by using the portion with small phase shifting in the preamble 1. Accordingly, the precision of frequency corrections can be made higher than in a case where frequency corrections are performed by using all the symbols.

Third Embodiment

A third embodiment described below is an example in which radio signals are FSK (Frequency Shift Keying)-modulated signals.

Figure 6:
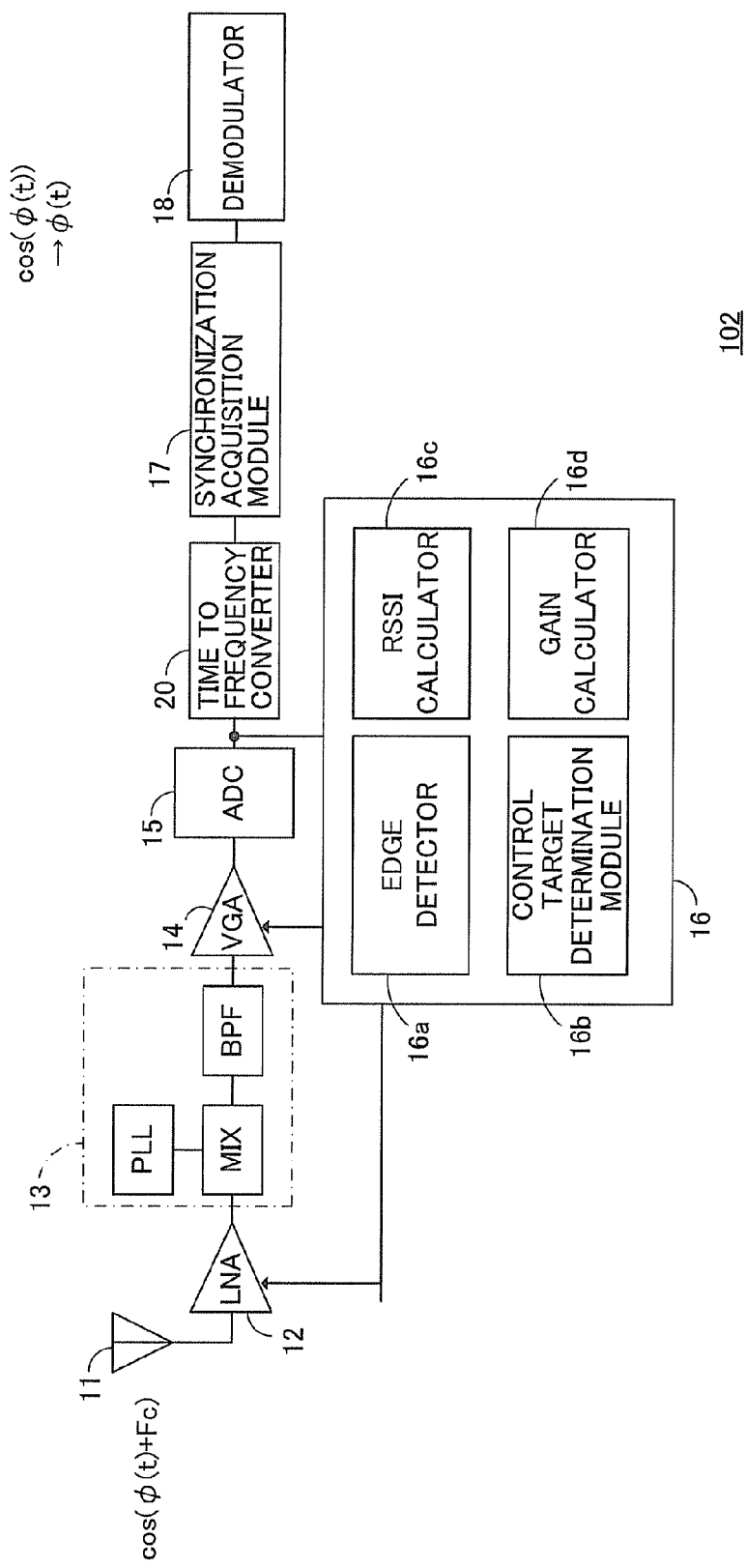
FIG. 6 is a block diagram schematically showing the structure of a receiver 102 according to the third embodiment.

FIG. 6 is a block diagram schematically showing the structure of a receiver 102 according to the third embodiment. Mainly the differences from the first and second embodiments will be described below.

The receiver 102 of this embodiment receives radio signals whose data modulation scheme is an FSK scheme. Specifically, a radio signal to be received by the receiver 102 is a signal cos ($\phi(t)$+Fc) generated by FSK-modulating a baseband signal $\phi(t)$. Here, Fc represents carrier frequency, the signal $\phi(t)$ may be a frequency domain signal, and the signal cos ($\phi(t)$+Fc) may be a time domain signal. The received radio signal is down-converted by the down-conversion module 13 into a baseband time signal cos ($\phi(t)$). The signal cos ($\phi(t)$) is also a constant envelope signal.

The receiver 102 further includes a time-to-frequency converter 20 provided in a stage before the synchronization acquisition module 17. The time-to-frequency converter 20 converts the time domain signal cos ($\phi(t)$) into a frequency domain signal $\phi(t)$.

As can be seen from the structure shown in FIG. 6, gain adjustments are performed on time domain signals cos ($\phi(t)$) and cos ($\phi(t)$+Fc) by the low noise amplifier 12 and the variable gain amplifier 14. Since both of the signals cos ($\phi(t)$) and cos ($\phi(t)$+Fc) are constant envelope signals, the auto gain controller 16 can set the gains of the low noise amplifier 12 and the variable gain amplifier 14 with higher precision.

Meanwhile, the synchronization pattern acquisition process is performed on the frequency domain signal $\phi(t)$ by the synchronization acquisition module 17. Even if the gains of the time domain signals cos ($\phi(t)$) and cos ($\phi(t)$+Fc) are adjusted, the frequency of the frequency domain signal $\phi(t)$ does not change. Therefore, even if a synchronization pattern is acquired while the variable gain of the variable gain amplifier 14 is being adjusted, as shown in FIGS. 3A and 3B, the variable gain adjustment rarely has adverse influence on the synchronization pattern acquisition.

As described above, in the third embodiment, radio signals subjected to data modulations by an FSK scheme are received. Accordingly, the precision of the synchronization pattern acquisition can be further increased.

Fourth Embodiment

In the above described first through third embodiments, the variable gain of the low noise amplifier 12 is firstly adjusted, and the variable gain of the variable gain amplifier 14 is then adjusted. In the fourth embodiment described below, on the other hand, the order of variable gain adjustments is not particularly limited.

Figure 7:
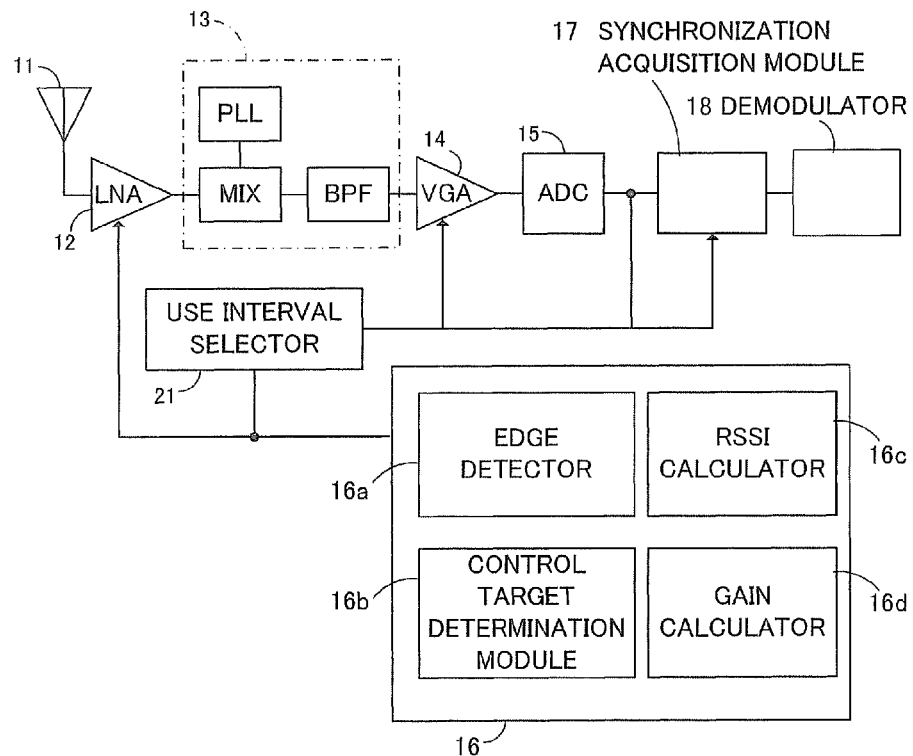
FIG. 7 is a block diagram schematically showing the structure of a receiver 103 according to the fourth embodiment.

FIG. 7 is a block diagram schematically showing the structure of a receiver 103 according to the fourth embodiment. Mainly the differences from the first through third embodiments will be described below.

The auto gain controller 16 of this embodiment does not need to firstly adjust the variable gain of the low noise amplifier 12, but may adjust the variable gains of the low noise amplifier 12 and the variable gain amplifier 14 at any time.

The receiver 103 further includes a use interval selector 21. The use interval selector 21 monitors the variable gain of the low noise amplifier 12 that is set by the auto gain controller 16, and selects an interval to be used for acquiring the synchronization pattern in the preamble 1. The synchronization acquisition module 17 acquires the synchronization pattern by using the interval selected by the use interval selector 21.

Figure 8:
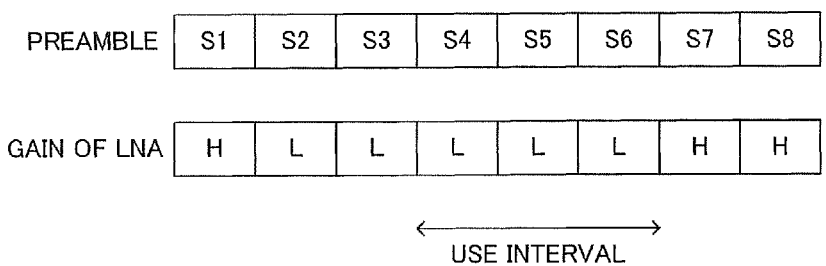
FIG. 8 is a diagram for explaining the processing operation of the use interval selector 21.

FIG. 8 is a diagram for explaining the processing operation of the use interval selector 21. This diagram is based on the following assumptions. The preamble 1 is formed with eight symbols S1 through S8, and the variable gain of the low noise amplifier 12 is set to H (high) or L (low). Further, the variable gain of the low noise amplifier 12 to be applied to the symbols S1, S7, and S8 is set to H, and the variable gain of the low noise amplifier 12 to be applied to the symbols S2 through S6 is set to L by the auto gain controller 16.

As shown in the drawing, the use interval selector 21 selects the portion formed with the symbols S4 through S6 among the preamble 1 to which a constant variable gain is applied as the interval to be used for acquiring the synchronization pattern. This is because phase shifting does not occur as long as the variable gain of the low noise amplifier 12 is constant. In other words, the symbols S2, S3, S7, and S8 are not used for acquiring the synchronization pattern because the variable gains applied thereto are just after switched, and thus, there is a high possibility that phase shifting has occurred therein.

If there is more than one interval in which the variable gain is constant, the use interval selector 21 selects the interval involving the largest number of symbols as the interval to be used for acquiring the synchronization pattern. Alternatively, correlators as shown in FIG. 4 may be used so that all the symbols from the earliest symbol to the latest symbol are stored in the correlators over several intervals, and the multiplication coefficients corresponding to the symbols having a possibility that phase shifting has occurred therein are set to 0.

As described above, in the fourth embodiment, the variable gain of the low noise amplifier 12 is monitored, and a synchronization pattern is acquired by using the symbols in the interval in which the variable gain is constant. Accordingly, the precision of the synchronization pattern acquisition can be increased.

Figure 9:
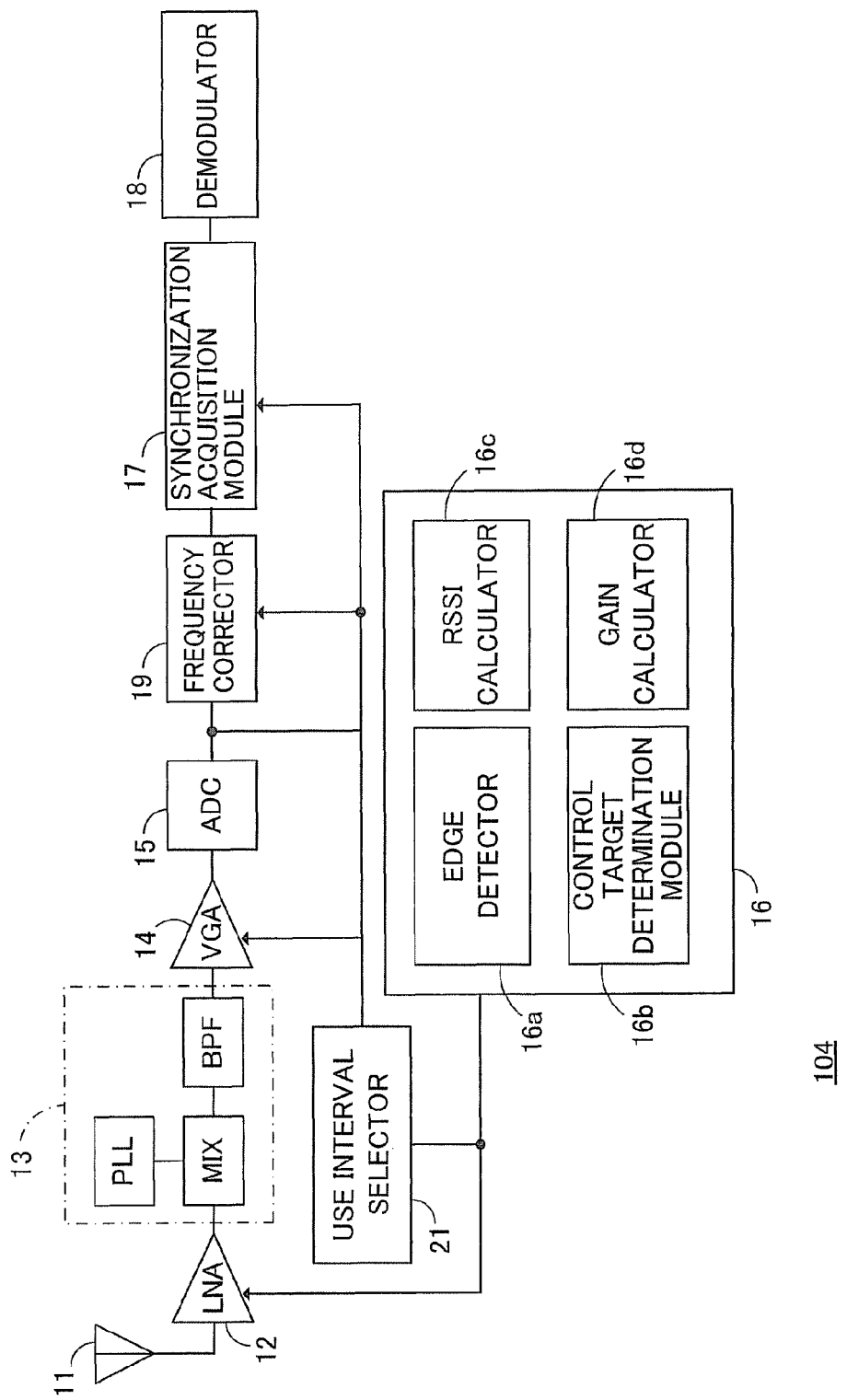
FIG. 9 is a block diagram schematically showing the structure of a receiver 104.

The receiver 103 according to the fourth embodiment may further include a frequency corrector 19, like a receiver 104 shown in FIG. 9. In that case, frequency corrections are preferably performed by using the interval in which the variable gain of the low noise amplifier 12 is constant.

In each of the above described embodiments, the down-conversion module 13 converts the frequency band of a signal from a radio frequency band to a baseband. However, the down-conversion module 13 may convert the frequency band of a signal from a radio frequency band to an intermediate frequency band (IF band). In that case, a PLL and a quadrature demodulator (QDEM) are provided in a stage after the AD converter 15, so that the frequency band of a signal is converted from an intermediate frequency band to a baseband. The frequency of the reference signal of the phase lock loop 13a is higher or lower than the frequency of a radio signal by the amount equivalent to the intermediate frequency.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A receiver configured to receive a radio signal comprising a preamble comprising a synchronization pattern and a payload containing data, the receiver comprising:
   an antenna configured to receive the radio signal;
   a low noise amplifier configured to amplify an output from the antenna by applying a first variable gain;
   a down-conversion module configured to down-convert an output from the low noise amplifier;
   a variable gain amplifier configured to amplify an output from the down-conversion module by applying a second variable gain;
   an auto gain controller configured to, in accordance with strength of the radio signal, firstly adjust the first variable gain, and after fixing the first variable gain, adjust the second variable gain;
   a synchronization acquisition module configured to acquire the synchronization pattern not using a portion of the preamble to which the first variable gain being adjusted is applied but using at least part of a portion of the preamble to which the second variable gain being adjusted is applied; and
   a demodulator configured to demodulate the payload in synchronization with the synchronization pattern acquisition by the synchronization acquisition module,
   wherein
   the preamble is formed with a plurality of symbols existing in a first time, and
   a sum of
      a time in which there exists a symbol to which the first variable gain being adjusted is applied,
      a time in which there exists a symbol to which the second variable gain being adjusted is applied, and
      a time in which there exists a symbol to be used by the synchronization acquisition module,
   is longer than the first time.

2. The receiver of claim 1, wherein
   the preamble is formed with a plurality of symbols, and
   the low noise amplifier is configured to
      apply the first variable gain being adjusted to a first number of the symbols from the beginning, and
      apply the fixed first variable gain to the following symbols.

3. The receiver of claim 1, wherein phase shifting between an input signal and an output signal at the variable gain amplifier due to a fluctuation in the second variable gain is smaller than phase shifting between an input signal and an output signal at the low noise amplifier due to a fluctuation in the first variable gain.

4. The receiver of claim 1, wherein
   the preamble is formed with a plurality of symbols,
   the synchronization acquisition module comprises:
   a plurality of multipliers each configured to multiply each corresponding symbol by a first coefficient, the multipliers being provided for the respective symbols;
   an adder configured to add up results of the multiplications performed by the multipliers; and
   a determiner configured to determine whether there exists the synchronization pattern based on a result of the addition performed by the adder, and
   the coefficient by which a symbol having the first variable gain being adjusted applied thereto is multiplied is 0.

5. The receiver of claim 4, wherein
   the low noise amplifier is configured to
      apply the first variable gain being adjusted to a first number of the symbols from the beginning, and
      apply the fixed first variable gain to the following symbols, and
   the coefficient by which the first number of symbols from the beginning is multiplied is 0.

6. The receiver of claim 1, further comprising
   a frequency corrector configured to correct a frequency of the received radio signal not using the portion of the preamble to which the first variable gain being adjusted is applied but using at least part of the portion of the preamble to which the second variable gain being adjusted is applied.

7. The receiver of claim 1, wherein
the radio signal is an FSK-modulated time domain signal, and
the receiver further comprises
a time-to-frequency converter configured to convert the time domain signal into a frequency domain signal, the time-to-frequency converter being located between the variable gain amplifier and the demodulator.

8. The receiver of claim 7, wherein
the low noise amplifier and the variable gain amplifier are configured to amplify the time domain signal, and
the synchronization acquisition module is configured to acquire the synchronization pattern from the frequency domain signal.

9. The receiver of claim 7, wherein the time domain signal is a constant envelope signal.

10. A receiver configured to receive a radio signal comprising a preamble comprising a synchronization pattern and a payload containing data, the receiver comprising:
an antenna configured to receive the radio signal;
a low noise amplifier configured to amplify an output from the antenna by applying a first variable gain;
a down-conversion module configured to down-convert an output from the low noise amplifier;
a variable gain amplifier configured to amplify an output from the down-conversion module by applying a second variable gain;
an auto gain controller configured to, in accordance with strength of the radio signal, firstly adjust the first variable gain, and after fixing the first variable gain, adjust the second variable gain;
a synchronization acquisition module configured to acquire the synchronization pattern not using a portion of the preamble to which the first variable gain being adjusted is applied but using at least part of a portion of the preamble to which the second variable gain being adjusted is applied; and
a demodulator configured to demodulate the payload in synchronization with the synchronization pattern acquisition by the synchronization acquisition module, wherein
the preamble is formed with a first number of symbols, and a sum of
a number of symbols to which the first variable gain being adjusted is applied,
a number of symbols to which the second variable gain being adjusted is applied, and
a number of symbols to be used by the synchronization acquisition module,
is larger than the first number.

11. A receiver configured to receive a radio signal comprising a preamble comprising a synchronization pattern and a payload containing data, the receiver comprising:
an antenna configured to receive the radio signal;
a low noise amplifier configured to amplify an output from the antenna by applying a first variable gain;
a down-conversion module configured to down-convert an output from the low noise amplifier;
a variable gain amplifier configured to amplify an output from the down-conversion module by applying a second variable gain;
an auto gain controller configured to adjust the first variable gain and the second variable gain in accordance with strength of the radio signal;
a synchronization acquisition module configured to acquire the synchronization pattern using at least part of a portion of the preamble to which a constant gain of the first variable gain applied; and
a demodulator configured to demodulate the payload in synchronization with the synchronization pattern acquisition by the synchronization acquisition module,
wherein, when there are a plurality of portions to which the constant gain of the first variable gain is applied, the synchronization acquisition module is configured to acquire the synchronization pattern using the longest one of the portions.

12. The receiver of claim 11, wherein the synchronization acquisition module is configured to acquire the synchronization pattern without using a portion of the preamble in which the first variable gain has just been switched.

13. The receiver of claim 11, further comprising
a use interval selector configured to monitor the first variable gain, and to select an interval among the preamble to be used by the synchronization acquisition module.

14. The receiver of claim 11, wherein phase shifting between an input signal and an output signal at the variable gain amplifier due to a fluctuation in the second variable gain is smaller than phase shifting between an input signal and an output signal at the low noise amplifier due to a fluctuation in the first variable gain.

15. The receiver of claim 11, wherein
the preamble is formed with a plurality of symbols,
the synchronization acquisition module comprises:
a plurality of multipliers each configured to multiply each corresponding symbol by a first coefficient, the multipliers being provided for the respective symbols;
an adder configured to add up results of the multiplications performed by the multipliers; and
a determiner configured to determine whether there exists the synchronization pattern based on a result of the addition performed by the adder, and
the coefficient by which a symbol having the first variable gain being adjusted applied thereto is multiplied is 0.

16. The receiver of claim 11, further comprising
a frequency corrector configured to correct a frequency of the received radio signal not using the portion of the preamble to which the first variable gain being adjusted is applied but using at least part of the portion of the preamble to which the second variable gain being adjusted is applied.

* * * * *